US012669633B2

(12) United States Patent
Kim et al.

(10) Patent No.: US 12,669,633 B2
(45) Date of Patent: Jun. 30, 2026

(54) LENS AND LENS ASSEMBLY

(71) Applicant: SAMSUNG ELECTRO-MECHANICS CO., LTD., Suwon-si (KR)

(72) Inventors: Byung Ju Kim, Suwon-si (KR); Na Yi Kang, Suwon-si (KR); Tae Kyung Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 251 days.

(21) Appl. No.: 18/406,744

(22) Filed: Jan. 8, 2024

(65) Prior Publication Data

US 2024/0264334 A1 Aug. 8, 2024

(30) Foreign Application Priority Data

Feb. 6, 2023 (KR) ........................ 10-2023-0015682

(51) Int. Cl.

*G02B 1/111* (2015.01)
*C09D 7/61* (2018.01)
*G02B 1/18* (2015.01)
*G02B 13/00* (2006.01)
*H05K 1/02* (2006.01)

(52) U.S. Cl.

CPC ................ *G02B 1/111* (2013.01); *C09D 7/61* (2018.01); *G02B 1/18* (2015.01); *G02B 13/0015* (2013.01); *H05K 1/0274* (2013.01)

(58) Field of Classification Search

CPC .. G02B 1/111; G02B 1/18; G02B 1/14; G02B 1/11; G02B 1/10; G02B 1/113; G02B 1/12; G02B 13/0015; G02B 3/00; G02B 7/02; C09D 7/61; H05K 1/0274; G03B 30/00

USPC .......................................................... 359/507

See application file for complete search history.

(56) References Cited

U.S. PATENT DOCUMENTS

2002/0024705 A1 2/2002 Nakano
2009/0239048 A1 9/2009 Sugihara et al.
2012/0154916 A1* 6/2012 Nishimoto ............. G02B 1/115 359/580
2015/0198821 A1* 7/2015 Miyamoto ............. G02B 1/041 427/164
2017/0031072 A1* 2/2017 Nakata .............. G02F 1/133528
2017/0097521 A1* 4/2017 Yoshida ................. G02C 7/107

(Continued)

FOREIGN PATENT DOCUMENTS

CN 209102937 U 7/2019
JP 4524877 B2 8/2010

(Continued)

OTHER PUBLICATIONS

Korean Office Action Issued on Jan. 3, 2025, in corresponding Korean Patent Application No. 10-2023-0015682. (5 pages in English and 5 pages in Korean).

(Continued)

*Primary Examiner* — William R Alexander
(74) *Attorney, Agent, or Firm* — NSIP Law

(57) ABSTRACT

A lens includes a lens unit, an intermediate layer disposed on one surface of the lens unit, a first coating layer including a UV improving additive and disposed on one surface of the intermediate layer, and a second coating layer including a water repellent and disposed on one surface of the first coating layer.

15 Claims, 14 Drawing Sheets

(56) References Cited

U.S. PATENT DOCUMENTS

| | | | | |
|---|---|---|---|---|
| 2017/0118855 | A1* | 4/2017 | Adib | C23C 14/34 |
| 2017/0155818 | A1* | 6/2017 | Bonnet | H04N 23/45 |
| 2017/0205538 | A1* | 7/2017 | Furusato | G04C 10/02 |
| 2020/0192120 | A1* | 6/2020 | Suzuki | G02B 5/0858 |
| 2021/0092268 | A1* | 3/2021 | Lin | G02B 13/0015 |
| 2021/0139660 | A1* | 5/2021 | Ihara | C09D 7/00 |
| 2021/0143362 | A1* | 5/2021 | Baek | G06F 1/1652 |
| 2021/0296621 | A1* | 9/2021 | Dai | H10K 59/879 |
| 2022/0196963 | A1* | 6/2022 | Suginome | G02B 27/0006 |
| 2022/0317339 | A1* | 10/2022 | Ono | G02B 1/18 |
| 2023/0022852 | A1 | 1/2023 | Lee et al. | |
| 2023/0072027 | A1* | 3/2023 | Ishimura | G02C 7/02 |
| 2023/0079905 | A1* | 3/2023 | Sakai | G02B 1/115<br>351/159.57 |
| 2023/0111587 | A1* | 4/2023 | Kousaka | G02C 7/108<br>351/159.01 |
| 2024/0184018 | A1* | 6/2024 | Ishizaki | G02B 1/113 |

FOREIGN PATENT DOCUMENTS

| | | | |
|---|---|---|---|
| JP | 2016-200781 | A | 12/2016 |
| KR | 10-1590077 | B1 | 2/2016 |
| KR | 10-2016-0067268 | A | 6/2016 |
| KR | 10-2321114 | B1 | 11/2021 |
| WO | WO 2012/076714 | A1 | 6/2012 |

OTHER PUBLICATIONS

Extended European search report issued on Jun. 25, 2024, in counterpart European Patent Application No. 24153446.0 (8 pages).

* cited by examiner

LENS AND LENS ASSEMBLY

CROSS-REFERENCE TO RELATED APPLICATIONS

This application claims the benefit under 35 USC 119(a) of Korean Patent Application No. 10-2023-0015682 filed on Feb. 6, 2023, in the Korean Intellectual Property Office, the entire disclosure of which is incorporated herein by reference for all purposes.

BACKGROUND

1. Field

The present disclosure relates to a lens and a lens assembly.

2. Description of the Background

Technologies related to automotive electronics, such as Advanced Driver Assistance System (ADAS) and autonomous driving, may be continuously developed, and along therewith, demand for electronic modules such as automotive cameras and sensors may be also increasing.

In detail, in the case of automotive cameras, cameras may be mounted in various locations such as the front and rear of the vehicle and the like, and may be exposed to an external environment, and may thus be easily contaminated by external contamination such as rainwater or various foreign substances.

To significantly reduce external contamination, a water-repellent coating may be applied to the surface of the outermost lens of the automotive camera. However, the water-repellent coating of the related art may deteriorate when exposed to the external environment for a long period of time due to low UV reliability, and it may thus be difficult to implement or maintain long-term water-repellent performance.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a lens includes a lens unit, an intermediate layer disposed on one surface of the lens unit, a first coating layer including a UV improving additive and disposed on one surface of the intermediate layer, and a second coating layer including a water repellent and disposed on one surface of the first coating layer.

The intermediate layer may be an Anti-Reflective (AR) coating layer.

A thickness of the first coating layer may be 1 to 40 nm.

A thickness of the first coating layer may be 10 nm or less, the first coating layer may not be provided on a portion of the one surface of the intermediate layer, and the second coating layer may be in contact with the one surface of the intermediate layer.

A thickness of the first coating layer may be less than a thickness of the second coating layer.

The UV improving additive of the first coating layer may include a UV absorber, an antioxidant, and a light stabilizer.

The UV improving additive may further include inorganic particles.

The inorganic particles may include at least one selected from the group consisting of $CeO_2$, ZnO, $TiO_2$, and $WO_3$.

The intermediate layer may include at least one material layer selected from the group consisting of siloxane, $SiO_2$, SiON, $Si_3N_4$, $TiO_2$, TiON, and TiN.

The intermediate layer may include a multilayer structure in which a first layer and a second layer having different refractive indices are alternately stacked one or more times.

A portable electronic device may include a lens assembly including the lens, and a printed circuit board (PCB) configured to convert an image of an object formed at the imaging plane of the lens assembly into an electrical signal.

In another general aspect, a lens assembly includes one or more lenses. At least one lens of the one or more lenses includes a lens unit, an intermediate layer disposed on one surface of the lens unit, a first coating layer including a UV improving additive and disposed on one surface of the intermediate layer, and a second coating layer including a water repellent and disposed on one surface of the first coating layer.

The at least one lens may be disposed on an outermost side of the lens assembly among the one or more lenses in an optical axis direction.

The at least one lens may be disposed on an outermost side of the lens assembly in the optical axis direction of the at least one lens.

A portable electronic device may include the lens assembly, and a printed circuit board (PCB) configured to convert an image of an object formed at the imaging plane of the lens assembly into an electrical signal.

The portable electronic device may further include a display unit configured to display an image based on the electrical signal, wherein the lens assembly may be covered by the display unit.

The portable electronic device may further include a tempered glass, wherein the lens assembly may be covered by the tempered glass.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
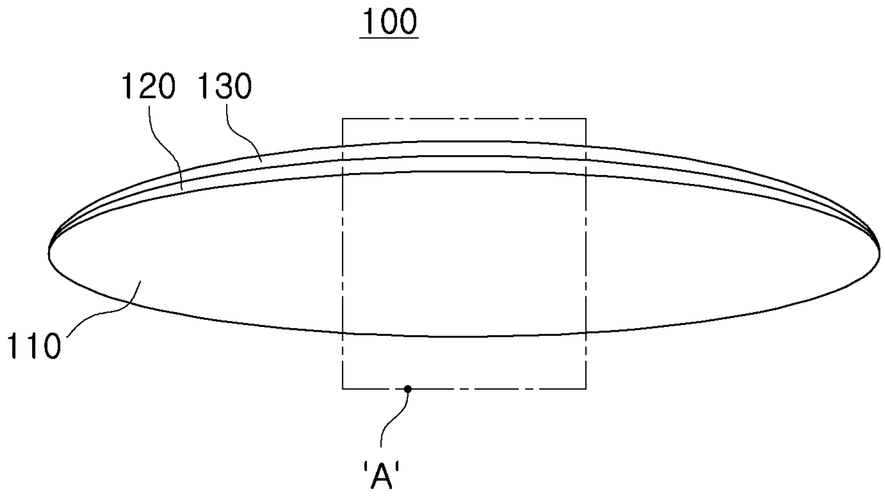
FIG. 1 is a perspective view schematically illustrating a lens according to an embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

An aspect of the present disclosure may provide a lens and a lens assembly including the same, which have a coating structure with improved UV reliability, and which may implement water repellent performance for a long period of time.

Figure 2:
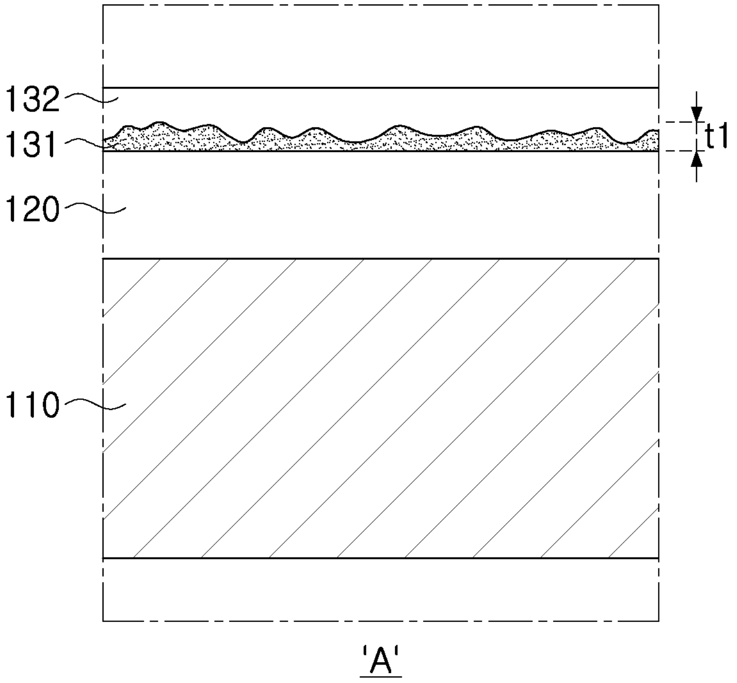
FIG. 2 is an enlarged cross-sectional view of a portion of the lens of FIG. 1.

FIG. 1 is a cross-sectional view schematically illustrating a lens according to an embodiment, and FIG. 2 is a cross-sectional view illustrating an enlarged area of the lens of FIG. 1.

Referring to FIGS. 1 and 2, a lens 100 according to an embodiment includes a lens unit 110, an intermediate layer 120, and a coating layer 130, the coating layer 130 may include a first coating layer 131 and a second coating layer 132.

In the case of the lens unit 110, the shape or type thereof is not particularly limited and may be implemented in the form of a lens that may be used in optical devices such as camera modules and the like.

Accordingly, the shape of the lens unit 110 may be transformed into a form other than the shape illustrated in FIG. 1.

The lens unit 110 may be formed of glass. However, the lens unit 110 may be formed of other materials, for example, a plastic resin containing a resin component.

For example, the plastic resin may include at least one component of polycarbonate and polyolefin.

In this case, the polyolefin may include at least one type of cycloolefin polymer and cycloolefin copolymer.

The intermediate layer 120 is disposed on one surface of the lens unit 110 to cover the one surface of the lens unit 110.

The intermediate layer 120 may be a buffer layer, and in this case, may be provided as a single layer.

When the intermediate layer 120 is provided as a buffer layer, the first coating layer 131 covering one side of the intermediate layer 120 may be formed uniformly with sufficient thickness as a whole and may effectively protect the lens unit 110.

This intermediate layer 120 may be formed using processes such as Chemical Vapor Deposition (CVD) and Physical Vapor Deposition (PVD).

Additionally, considering the function thereof as a buffer layer, the intermediate layer 120 may include at least one material layer selected from the group consisting of siloxane, $SiO_2$, SiON, $Si_3N_4$, $TiO_2$, TiON and TiN.

Figure 3:
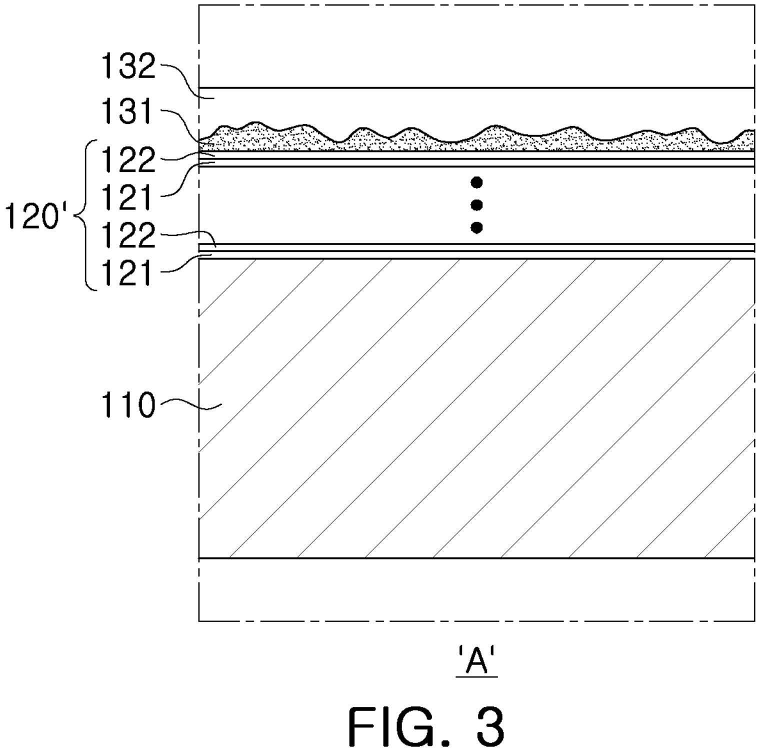
FIG. 3 is an enlarged cross-sectional view of a portion of a lens according to another embodiment.

FIG. 3 illustrates another embodiment. Referring to FIG. 3, an intermediate layer 120' may be an anti-reflective coating layer (AR coating layer).

When the intermediate layer 120' is implemented as an AR coating layer, the reflectivity of the lens 100 may be reduced, and thus a flare phenomenon may be reduced or prevented.

In this case, the intermediate layer 120' may include a multilayer structure in which a first layer 121 and a second layer 122 having different refractive indices are alternately stacked one or more times.

Additionally, the intermediate layer 120' may have a stack structure in which the first layer 121 is a $SiO_2$ layer and the second layer 122 is a $TiO_2$ layer.

This AR coating layer may be formed by coating one side of the lens unit by an Electron-beam process using an E-beam evaporator equipped with a thermal device.

On the other hand, the thickness of the intermediate layers 120 and 120' may be measured using both non-destructive testing and destructive testing.

Examples of non-destructive testing include methods using an ellipsometer, a reflectometer, an atomic force microscope, and the like.

As an example of destruction analysis, the intermediate layers 120 and 120' may be cross-sectioned by Focused Ion Beam (FIB) and then subjected to transmission electron microscope (TEM) analysis, and components thereof may also be analyzed through EDS analysis. In addition, the analysis may also be performed using FT-IR, XPS, or the like.

The cross-section of the intermediate layers 120 and 120' may be taken to include the central portion of the lens unit 110, for example, a thickest area of the lens unit 110.

Additionally, the thickness of the intermediate layers 120 and 120' may be defined as a distance measured in a direction perpendicular to the surface and may be determined as an average of values measured in a plurality of equally spaced areas.

The first coating layer 131 is disposed on one side of the intermediate layer 120 to cover at least a portion of the one side of the intermediate layer 120.

The first coating layer 131 is employed to prevent UV reliability from deteriorating, and the like, and includes a UV improving additive to obtain this usage.

UV improving additives may include UV absorbers, antioxidants, and hindered amine light stabilizers.

Antioxidants may be, in detail, phenolic or phosphite types, and as the antioxidant, among tetrakismethylene (3,5-di-tert-butyl-4-hydroxycinnamenate) methane, octodecyl 3,5-di-tert-butyl-4-hydroxyhydrocinnamate, ethylenebis (oxygen ethylene)bis-3-tert-butyl-4-hydroxy-5-methylhydrocinnamenate, n-octadecyl-3-(3',5'-di-tert-butyl-4'-hydroxy phenyl) propionate, triethylene glycol bis[3-(3-tert-butyl-4-hydroxy-5-methylphenyl) propionate], 3,9-bis-[1,1-di-methyl-1-2-â-(3-tert-butyl-4-hydroxy-5-ethylphenyl) propionylethyl]-2,4,8,10-tetraoxasphino[5,5] undecane, 2,2-thio diethylene bis[3-(3,5-di-tert-butyl-4-hydroxyphenyl) propionate, tetrakis[methylene-3(3'5'-di-tert-butyl-4'-hydroxyphenyl) propionate] methane, benzene propionic acid, and 3,5-bis-(1,1-dimethyl-ethyl)-4-hydroxy-C7 to C9 pulverized alkyl esters, a single type selected therefrom or a mixture of two or more types selected therefrom may be used, and among tetrakismethylene (3,5-di-tert-butyl-4-hydroxycinnamenate) methane, octodecyl 3,5-di-tert-butyl-4-hydroxyhydrocinnamate, benzene propionic acid and 3,5-bis-(1,1-dimethyl-ethyl)-4-hydroxy-C7 to C9 pulverized alkyl esters, a single type selected therefrom or a mixture of two or more types selected therefrom may be used.

Light stabilizer (a hindered amine light stabilizer) may include at least one selected from, N-(4-alkoxycarbonylphenyl)-N'-alkyl-N'-phenylformamidine, hydroxyphenylbenzotriazole, bis-(1,2,2,6,6-pentamethyl-4-piperidyl)sebacate and bis-(1-octyl-2,2,6,6-tetramethyl-4-piperidyl)sebacate, and may include a single type or two or more types selected from N-(4-methoxycarbonylphenyl)-N'-methyl-N'-phenylformamidine, N-(4-ethoxycarbonylphenyl)-N'-methyl-N'-phenylformamidine and N-(4-ethoxycarbonylphenyl)-N'-ethyl-N'-phenylformamidine.

The first coating layer 131 may be formed by coating a UV improving additive on one surface of the intermediate layer 120 using a thermal or E-beam process.

In addition, the UV improving additive may include inorganic particles. As an example, the UV absorber may include inorganic particles.

In addition, as the UV absorber, among methyl 2-(3-tert-butyl-2-hydroxy-5-methoxyphenyl)-2H-benzotriazole-5-carboxylate, methyl 2-(2-hydroxy-5-methoxy-3-tert-octylphenyl)-2H-benzotriazole-5-carboxylate, octyl 2-(3-tert-butyl-2-hydroxy-5-methoxyphenyl)-2H-benzotriazole-5-carboxylate, 2-ethylhexyl 2-(3-tert-butyl-2-hydroxy-5-methoxyphenyl)-2H-benzotriazole-5-carboxylate, octyl 2-(3-tert-butyl-2-hydroxy 5-octyloxyphenyl)-2H-benzotriazole-5-carboxylate, methyl 2-[3-tert-butyl-2-hydroxy-5-(2-methacryloyloxyethoxy)phenyl]-2H-benzotriazole-5-carboxylate, phenyl 2-(3-tert-butyl-2-hydroxy-5-methoxyphenyl)-2H-benzotriazole-5-carboxylate, 2-methacryloyloxy ethyl 2-(2-hydroxy-5-methoxyphenyl)-2H-benzotriazole-5-carboxylate, 2-acryloyloxyethyl 2-(3-tert-butyl-2-hydroxy-5-methoxyphenyl)-2H-benzotriazole-5-carboxylate, 2-methacryloyloxyethyl 2-3-tert-butyl-2-hydroxy-5-methoxyphenyl)-2H-benzotriazole-5-carboxylate, a single type selected therefrom or a mixture of two or more types selected therefrom may be used.

In a case in which a UV absorber is formed using only organic materials, the chemical structure of the organic material may be deformed due to the photon energy of UV light, and as a result, there is a possibility that the UV absorber may be discolored or deformed.

Therefore, when inorganic particles are used as UV absorbers, discoloration and deformation caused by UV light may be significantly reduced, and thus the reliability of the lens 100 may be improved.

In addition, the UV absorber does not have to be implemented only with inorganic components and may further include organic materials.

By including more organic materials in the UV absorber, the absorbable UV wavelength band may be broadened and the UV absorption efficiency may be further improved.

Examples of organic materials that may be included in the UV absorbers may include benzophenones, oxalanilides, benzotriazoles, triazines, and the like, and respective materials have advantages of low costs (benzophenones), low discoloration (oxalanilides), high absorbance (benzotriazoles, triazines), and the like.

On the other hand, the antioxidant and light stabilizer may also contain inorganic particles and organic materials similar to those included in the UV absorber described above, and detailed description thereof will be omitted to avoid duplication.

Considering the function of the first coating layer 131, a thickness (t1) of the first coating layer 131 may be less than a thickness of the second coating layer 132, and in detail, the thickness of the first coating layer may be 1 to 40 nm.

In this case, the thickness t1 of the first coating layer 131 may be measured using the non-destructive test or destructive test described above with respect to the intermediate layer 120.

However, in a case in which the first coating layer 131 is very thin and it is difficult to use the thickness measurement method described above, the components of the first coating layer 131 may be confirmed by performing Energy Dispersive X-ray Spectroscopy (EDS) analysis in the thickness direction during TEM analysis, thereby identifying the first coating layer 131.

The second coating layer 132 is disposed on one side of the first coating layer 131. The second coating layer 132 may be formed of an organic material layer. For example, the second coating layer 132 may include perfluoropolyether (PFPE), polytetrafluoroethylene (PTFE), perfluoroalkyl vinyl ether copolymer (PFA), a fluoro-carbon component having a silane-containing reactive crosslinking group, or the like.

In addition, the second coating layer 132 is employed for preventing surface oxidation of the lens unit 110, and the like, and contains a water repellent agent to perform a water repellent function.

The second coating layer 132 may be formed by coating a water repellent agent on one surface of the first coating layer 131 using an E-beam and thermal deposition process.

As the uses of the lens 100 are diversifying, the need to properly protect the lens 100 from the external environment is increasing, and this need is even higher for lenses that are always exposed externally, such as vehicle cameras and the like used for automotive cameras.

Figure 22:
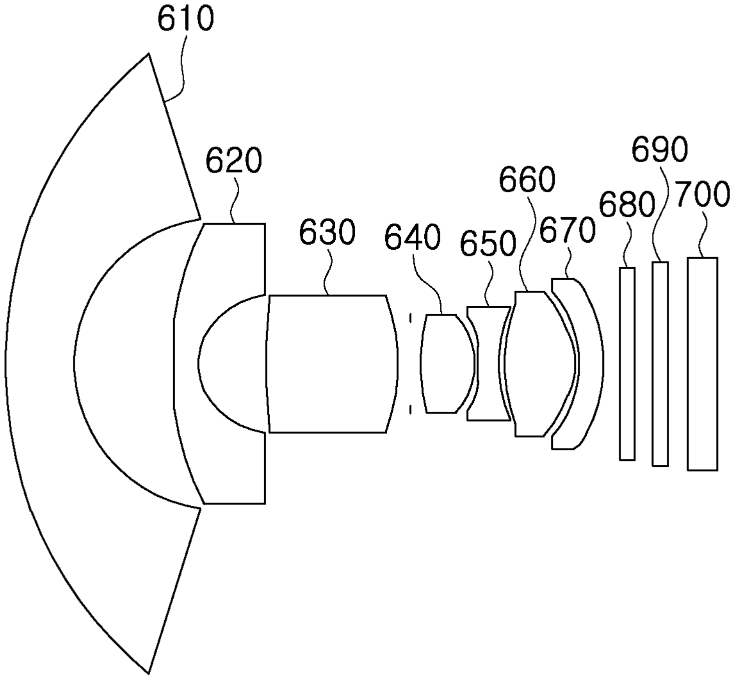
FIG. 22 is an exploded view schematically illustrating the structure of an electronic automotive camera according to an embodiment.

As illustrated in FIG. 22, a lens assembly of the automotive camera may include a plurality of lenses 610, 620, 630, 640, 650, 660 and 670, an IR filter 680, a cover glass 690, and a printed circuit board (PCB) 700. For example, the plurality of lenses 610-670 may be sequentially disposed in ascending numerical order along the optical axis from an object side of the lens assembly toward an imaging plane of the lens assembly, with the first lens 610 being closest to the object side of the lens assembly (located at the forefront) and the seventh lens 670 being closest to the imaging plane. The PCB 700 may include an image sensor having an imaging surface disposed at the imaging plane of the lens assembly. The image sensor converts an image of an object formed on an effective imaging area of the imaging surface by the plurality of lenses 610-670 into an electrical signal.

In this case, for example, the lens 100 including the first and second coating layers 131 and 132 according to an embodiment may be applied to the lens 610 located at the forefront.

In the lens 100 of an embodiment, deterioration of optical properties due to contamination, moisture or the like on the surface of the lens 100 may be effectively suppressed by the second coating layer 132 containing a water repellent.

In this case, as the water repellent, polytetrafluoroethylene (PTFE), fluorinated ethylene propylene (FEP), perfluoroalkyl vinyl ether copolymer (PFA), polyvinyl fluoride (PVF), perfluoropolyether (PFPE) containing fluorine polymers, or the like may be used.

In addition, the intermediate layer 120 may be protected from UV light by the first coating layer 131 containing a UV improving additive, and since the content of the UV improving additive may be significantly increased, damage to the intermediate layer 120 caused by UV light may be significantly reduced.

In the case of the components of related art lens thin films, the components may be analyzed by methods such as Fourier-transform infrared spectroscopy (FT-IR), Polarization modulation-infrared reflection-adsorption spectroscopy (PM-IRRAS), Nuclear Magnetic Resonance spectroscopy (NMR), Elemental Analysis, Mass spectroscopy, and the like.

As illustrated in FIGS. 18 to 21, when the surface of the water-repellent coating layer for which the UV reliability evaluation has been completed is analyzed by XPS, it can be seen that the CFX series, the main component of the water-repellent coating layer, decreases and the C—C, C—H, and Si—O structures relatively increase.

For example, from these results, it can be confirmed that UV irradiation breaks the bond at a site where the internal bonding energy of the water-repellent coating layer is weak, forming free radicals, and structural destruction (change) has occurred, and thus, it can be seen that the water-repellent power of the water-repellent coating layer is reduced.

Recently, with regard to water-repellent coating materials, materials that may be easily used for, for example, wet or spray may be easily obtained nearby.

However, most water-repellent coating materials used in wet methods lack reliability, and thus it may be difficult to obtain performance.

However, some professional coating companies are applying water-repellent coatings using vacuum deposition methods, but there are still limitations in implementing long-term water-repellent effects due to relatively low UV reliability.

When analyzing the water-repellent coating layer of a conventional professional company using vacuum deposition, it can be confirmed that it is a thin film fluorine (F) coating.

According to an embodiment of the present disclosure, a first coating layer that is separate from the water repellent layer is separately formed on one side of the AR coating layer, which is the intermediate layer, using a UV improving additive.

As in an embodiment, when the lens has a stack structure of the first and second coating layers, not only may the content of the UV improving additive contained in the first coating layer be easily adjusted, but the amount of UV improving additives may be maximized as compared to the case of including UV improving additives of the related art directly in the water repellent layer, and therefore, the UV reliability of the lens may be significantly improved.

Figure 17:
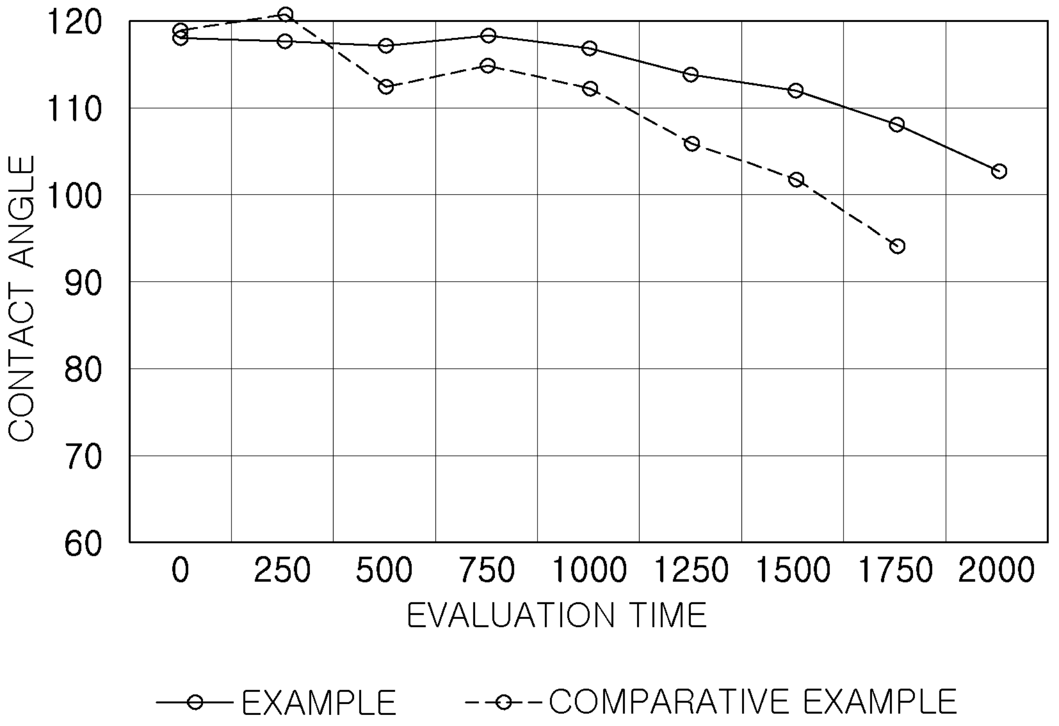
FIG. 17 illustrates UV reliability evaluation results of first and second coating layers according to an embodiment.
Figure 18:
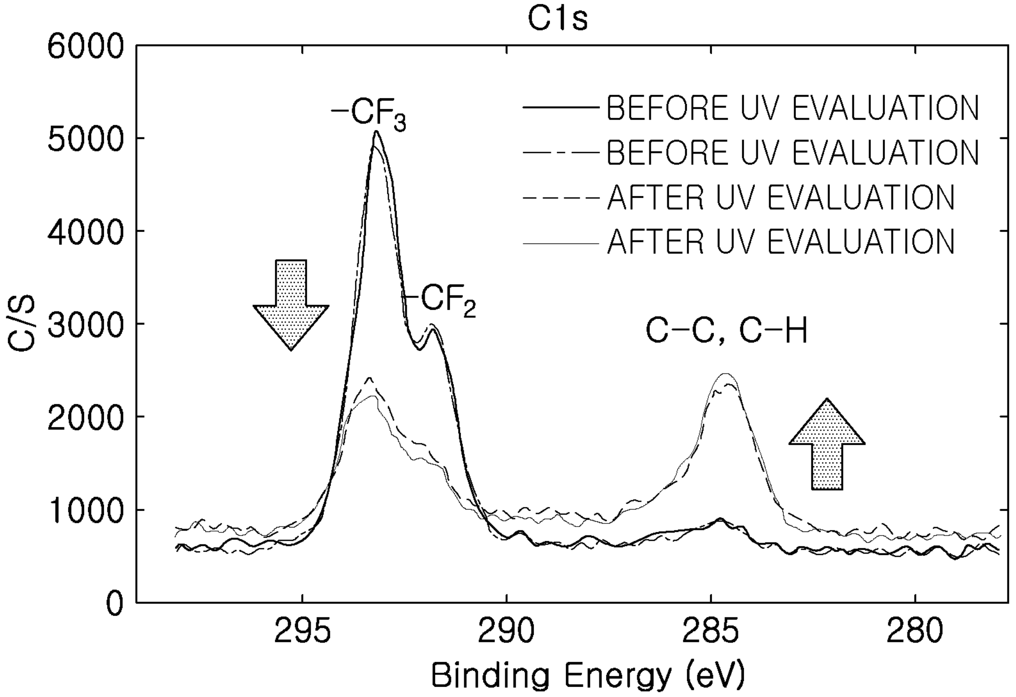
FIGS. 18 to 21 are graphs illustrating the results of XPS analysis of the surface of a water-repellent coating layer for which UV reliability evaluation has been completed in the prior art.
Figure 19:
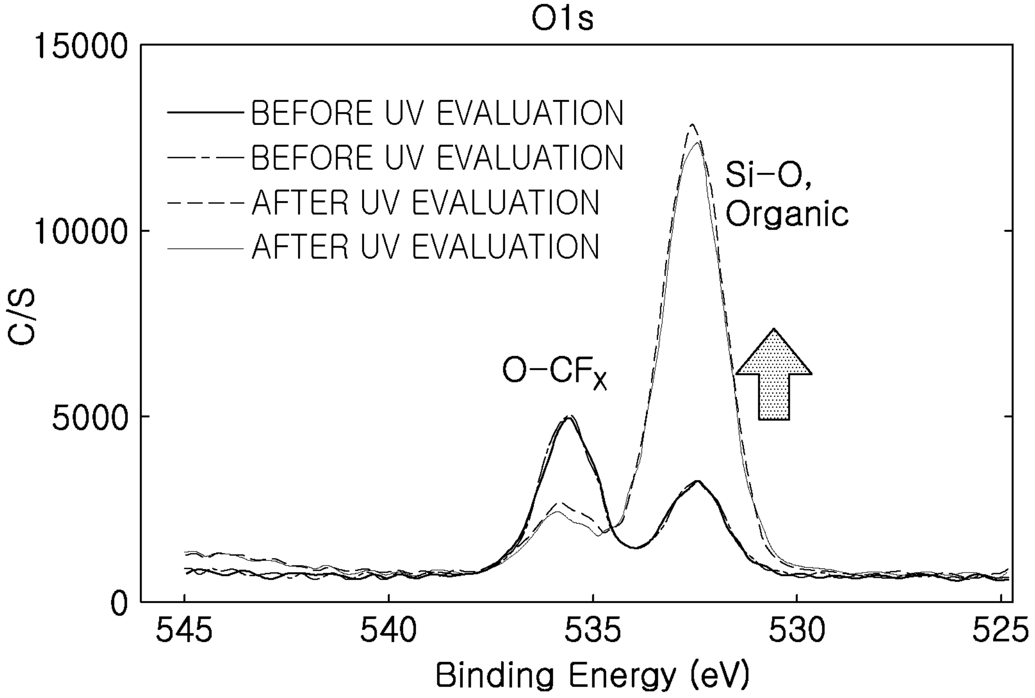
Figure 20:
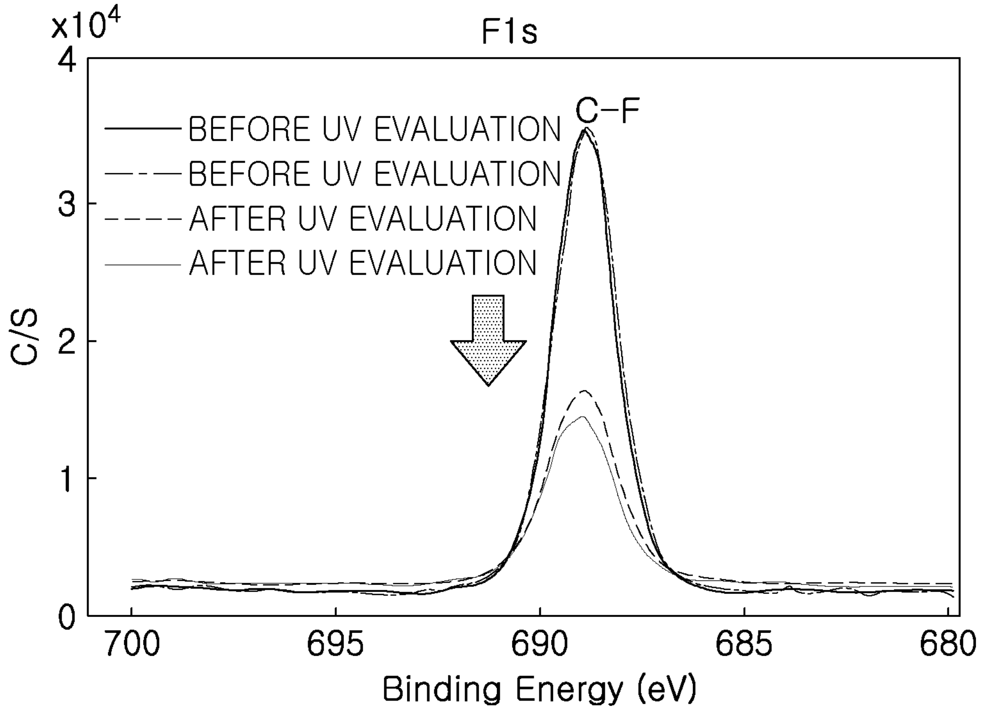
Figure 21:
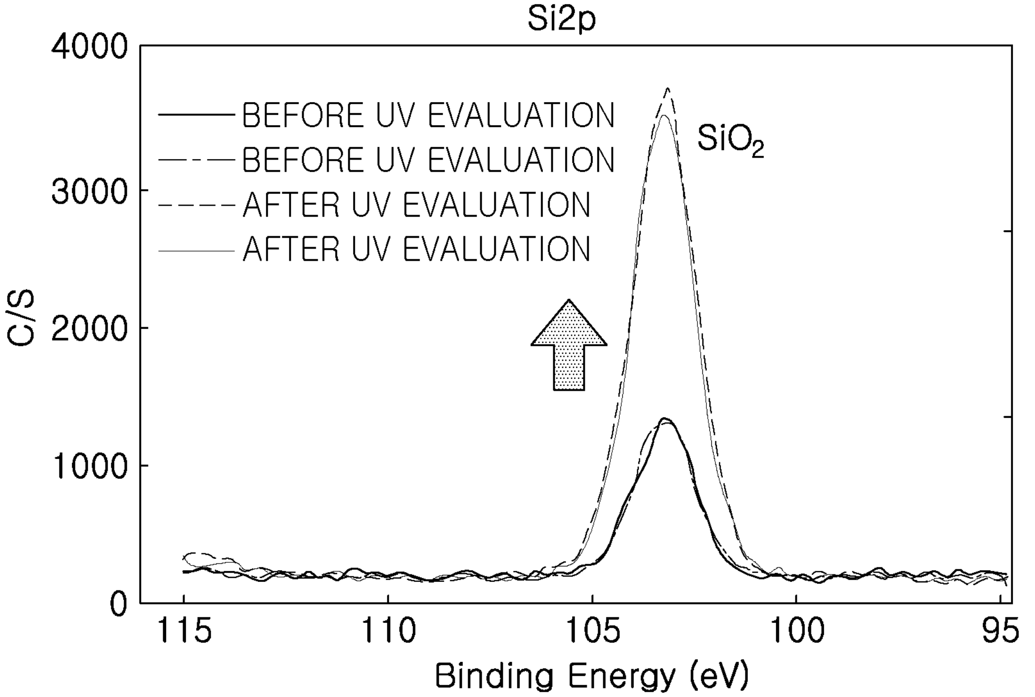

FIG. 17 illustrates the UV reliability evaluation results. In this case, the comparative example is a structure in which only the second coating layer, a water-repellent layer, is formed on the intermediate layer without the first coating layer, and the embodiment example provides a structure including both first and second coating layers according to an embodiment of the present disclosure. In this case, the comparative example does not include any UV improving additives in the second coating layer.

Referring to FIG. 17, in the case of a comparative example without using a UV improving additive, after conducting the UV weather resistance evaluation, it can be seen that after 1,500 hours, the moisture contact angle decreases below 100°, and thus the water repellency decreases.

On the other hand, in the case of a multilayer structure in an embodiment example in which a first coating layer is formed with a UV improving additive and a second coating layer, which is a water-repellent layer, is formed on the first coating layer; it can be seen that even after 2,000 hours of UV weather resistance evaluation, the water contact angle is 100° or more and water repellency is maintained.

Therefore, it can be confirmed that the lens structure including the first and second coating layers of the present disclosure has excellent UV reliability.

Figure 4:
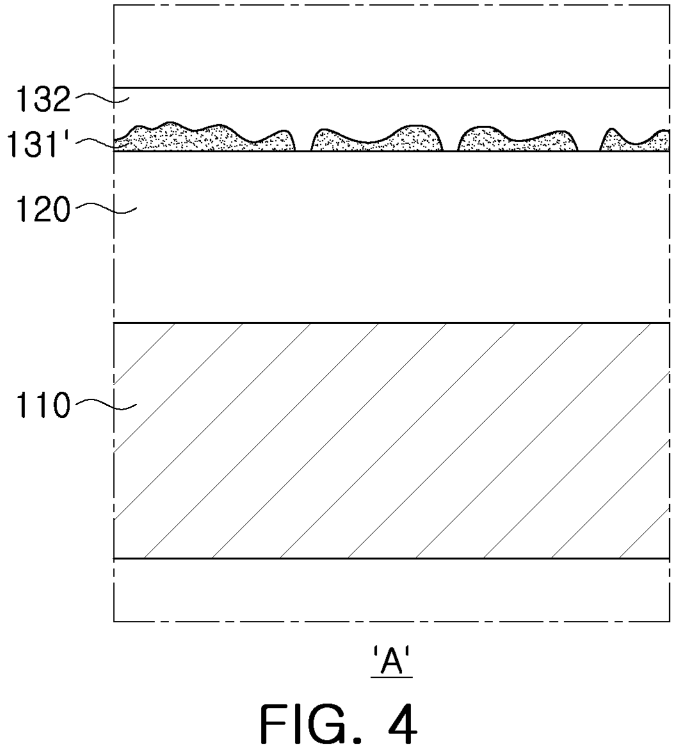
FIG. 4 is an enlarged cross-sectional view of a portion of a lens according to another embodiment.

On the other hand, as illustrated in FIG. 4, in the case in which a first coating layer 131' is formed to have a thickness as low as 10 nm or less, an island (island-shaped) structure may be formed on one side of the intermediate layer 120.

For example, when the thickness of the first coating layer 131' is 10 nm or less, the first coating layer 131' may not be formed on a portion of one surface of the intermediate layer 120.

Accordingly, a portion of the second coating layer 132 comes into direct contact with the intermediate layer 120, and this action improves adhesion with the intermediate layer 120, thereby reducing the defect rate of products.

In this case, the area in which the first coating layer 131' is formed may be known by checking the carbon peak during component analysis.

Figure 13:
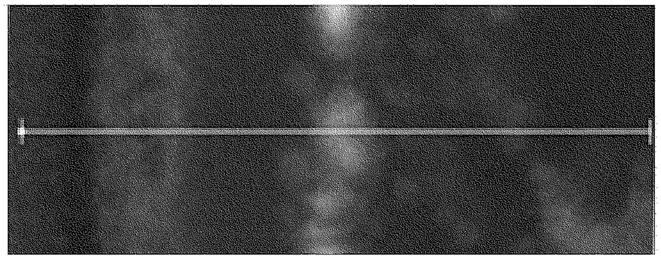
FIGS. 13 to 16 illustrate the results of component analysis to confirm whether or not a first coating layer is formed.
Figure 14:
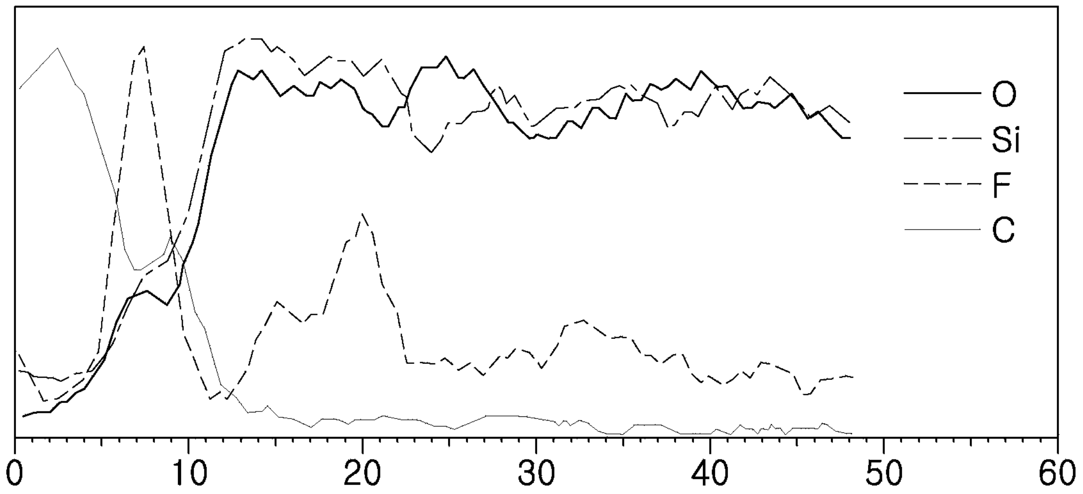
Figure 15:
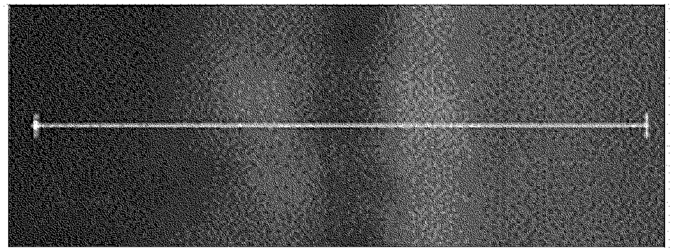
Figure 16:
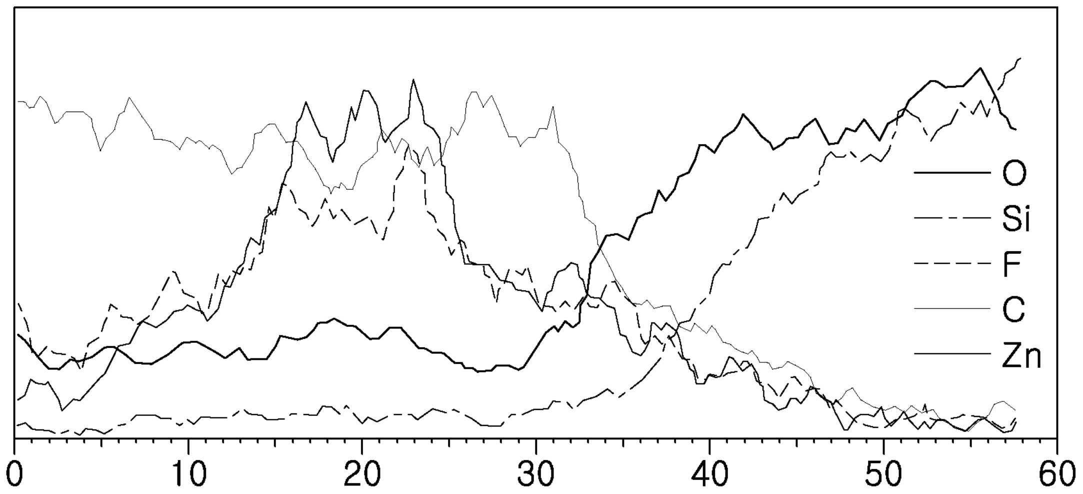

For example, as illustrated in FIGS. 13 and 14, no increase in carbon peak is found in the area without additives, and as illustrated in FIGS. 15 and 16, it can be seen that the carbon peak increases in the area in which the UV improving additive is present. Accordingly, the area in which the first coating layer 131' is formed on the intermediate layer 120 may be confirmed.

Figure 10:
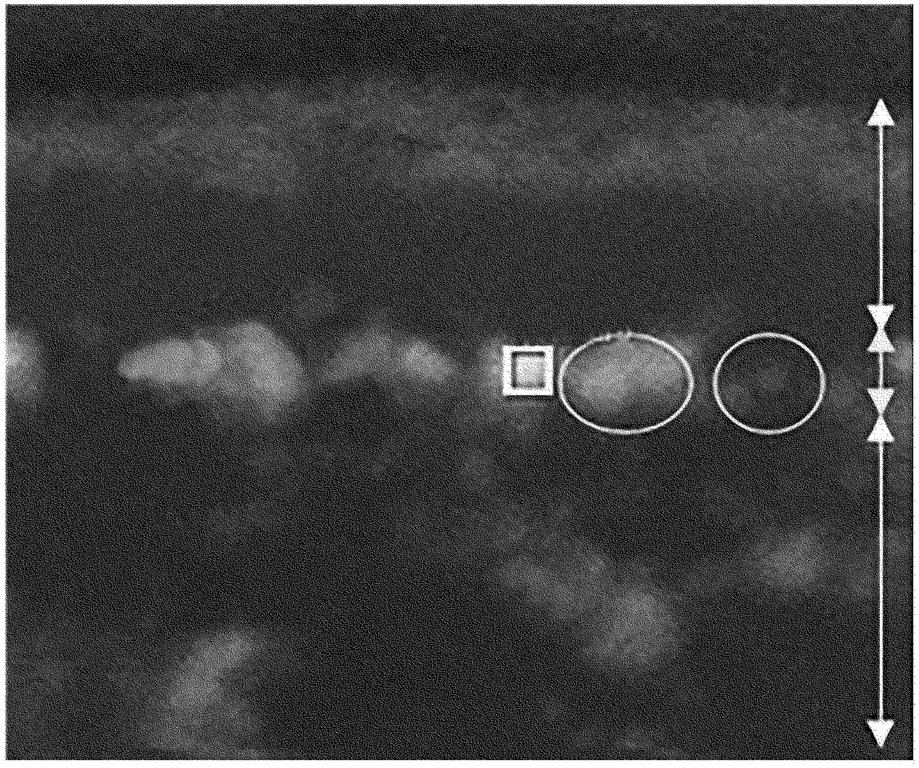
FIG. 10 is a cross-sectional photograph of a lens according to another embodiment of FIG. 3.

In addition, FIG. 10 illustrates the results analyzed by TEM after coating the first coating layer to a thickness of 3 nm on the intermediate layer using a UV improving additive.

As a result, it can be confirmed that the first coating layer is formed in an island structure, and it can thus be confirmed that a portion of the second coating layer is in direct contact with one surface of the intermediate layer.

Figure 11:
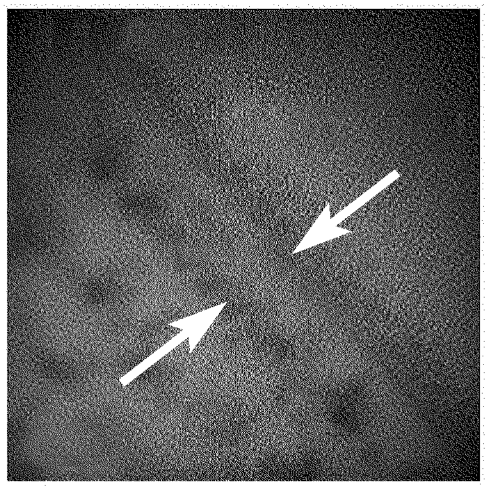
FIGS. 11 and 12 are cross-sectional photographs of a lens according to another embodiment of FIG. 1.
Figure 12:
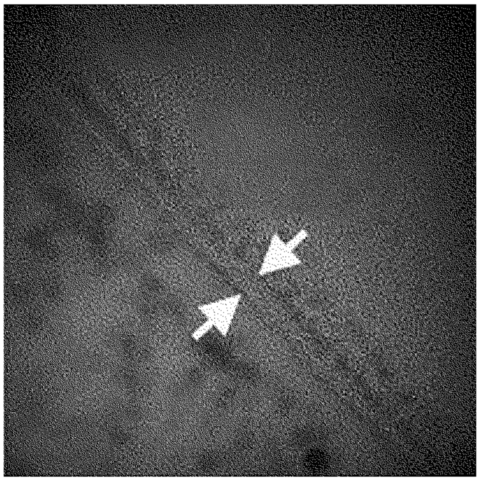

In addition, FIGS. 11 and 12 are images analyzed by TEM after coating the first coating layer to a thickness of 11 to 40 nm, in more detail, 15 nm, using a UV improving additive. The lower part is a substrate formed of glass or the like, the middle part is the intermediate layer and the first coating layer, and the upper part is the second coating layer.

Referring to FIGS. 11 and 12, it can be seen that, unlike FIG. 10, the first coating layer is formed uniformly without any gaps, and an island structure without the first coating layer is not found.

Hereinafter, examples in which the above-described lens is applied will be described with reference to FIG. 5.

Figure 5:
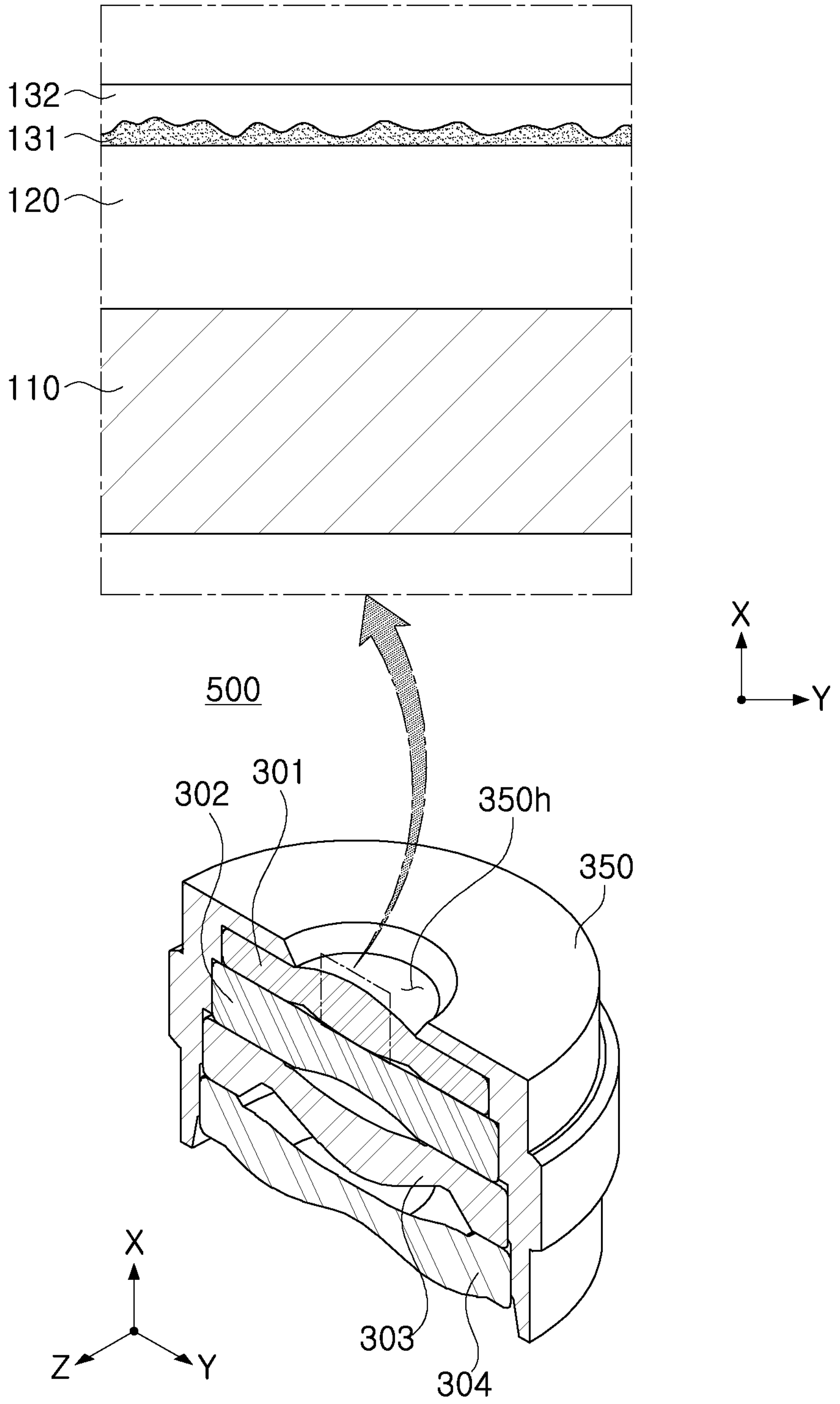
FIG. 5 is a cut-away perspective view schematically illustrating a lens assembly.

First, FIG. 5 is a cut-away perspective view schematically illustrating the lens assembly.

A lens assembly 500 may include at least one lens 301-304.

In an embodiment, the lens assembly 500 includes four lenses 301-304, and in this case, the number or respective shapes of the lenses 301-304 may be changed depending on conditions such as required function, size or the like.

The lens assembly may be applied to portable electronic devices such as smartphones, tablet PCs, and laptop PCs, or to automotive cameras.

For example, in the case of an automotive camera, the lens assembly may include six to eight lenses, and in some cases, may include less than six lenses or nine or more lenses.

Additionally, the lens assembly 500 may include a lens barrel 350 having a lens hole **350*h* in addition to the plurality of lenses 301-304. For example, the plurality of lenses 301-304 may be sequentially disposed in ascending numerical order along the optical axis from an object side of the lens assembly 500 toward an imaging plane of the lens assembly 500, with the first lens 301 being closest to the object side of the lens assembly 500 and the fourth lens 304** being closest to the imaging plane.

The lens barrel 350 may have a hollow cylindrical shape, and the lens hole **350*h* for light transmission may be formed in one surface of the lens barrel 350**.

In this case, at least one lens 301 among the plurality of lenses 301 to 304 of the lens assembly 500 may use the lens according to the embodiment described above.

For example, as illustrated, the lens 301 includes a lens unit 110, an intermediate layer 120, a first coating layer 131, and a second coating layer 132, and in this case, the first coating layer 131 contains a UV improving additive, and the second coating layer 132 contains a water repellent agent.

The lens 301 including the first and second coating layers 131 and 132 may be disposed on the outermost side of the lens assembly 500 among the plurality of lenses 301-304 in the side where light enters, for example, in the optical axis direction (X-direction based on the drawings).

Among the plurality of lenses 301-304, the outermost lens 301 has a relatively greatest influence on the reliability, reflectivity, and the like of the lens assembly 500, and thus, as in an embodiment, by employing the lens 301 with the first and second coating layers 131 and 132 on the outer side, the effect of reducing reflectivity as well as durability of the lens assembly 500 against UV light, and the like, may be significantly increased.

On the other hand, the lens 301 may have various structures (e.g., the shape illustrated in FIG. 3 or 4) described above in addition to the shape illustrated in FIG. 5.

Additionally, the reliability of the lens assembly 500 may be further improved by applying the coating portion as in the lens 301 to at least one of the remaining lenses 302-304 other than the outermost lens 301.

These various modified structures for the lens assembly 500 may also be applied to portable electronic devices below.

Figure 6:
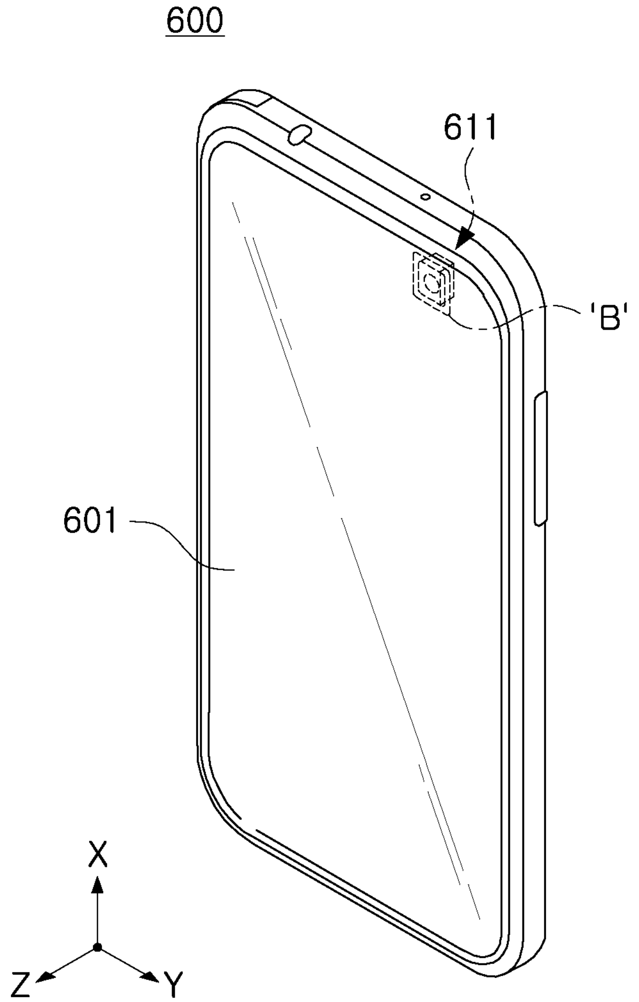
FIGS. 6 and 7 are perspective views schematically illustrating a portable electronic device and illustrate front and rear portions, respectively.
Figure 7:
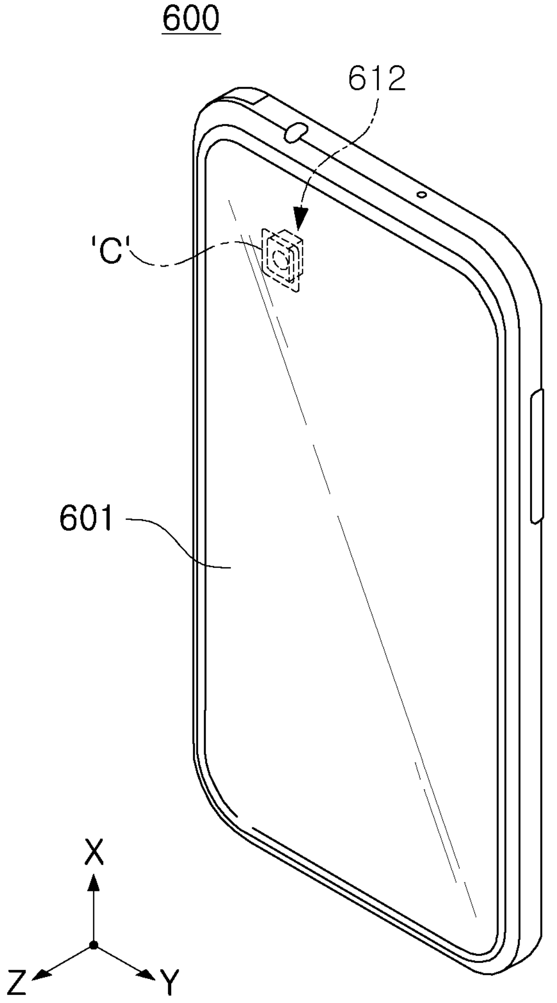

FIGS. 6 and 7 are perspective views schematically illustrating a portable electronic device, and illustrate the front and rear portions, respectively.

Figure 8:
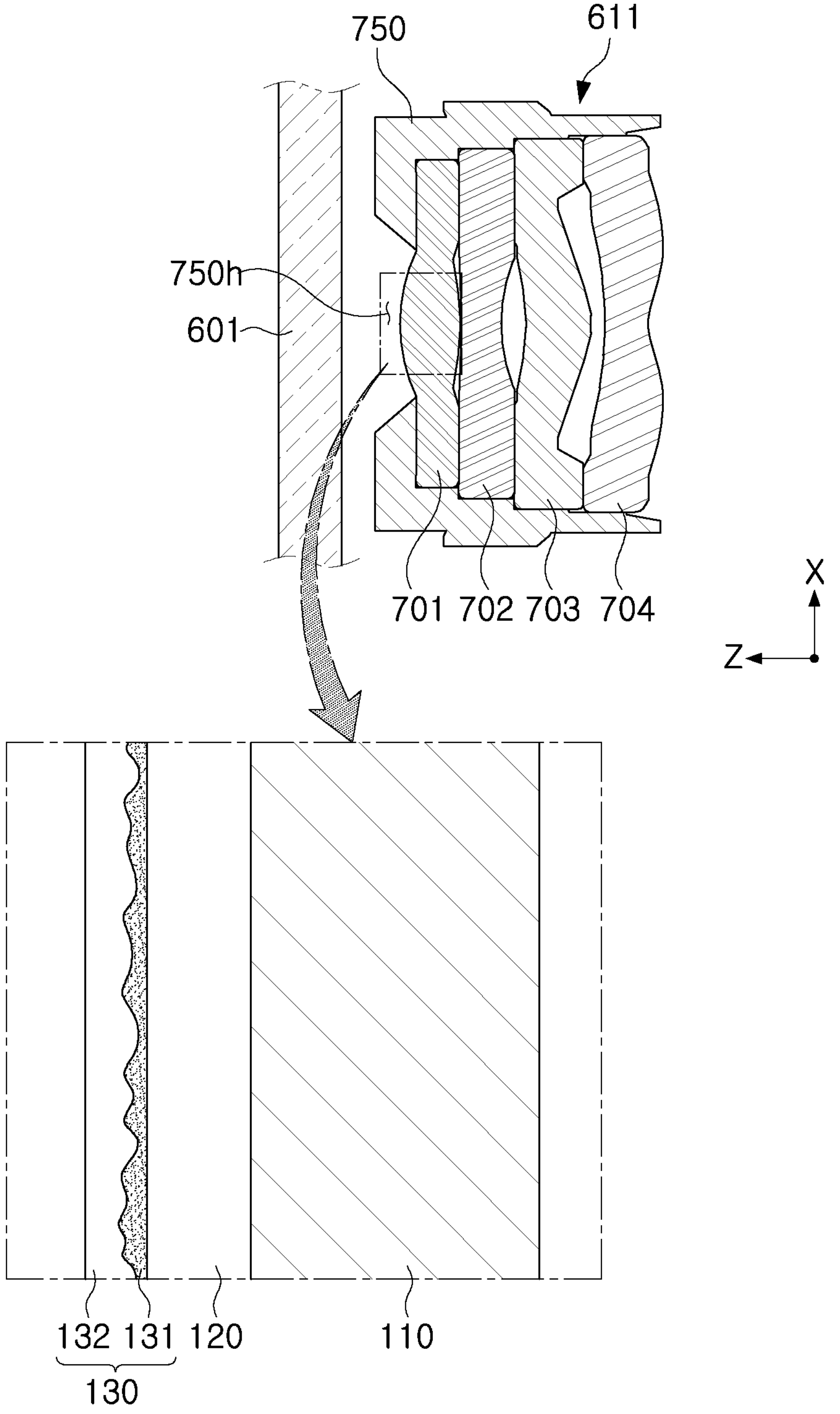
FIGS. 8 and 9 are enlarged cross-sectional views of a peripheral area of the lens assembly in FIGS. 6 and 7, respectively.
Figure 9:
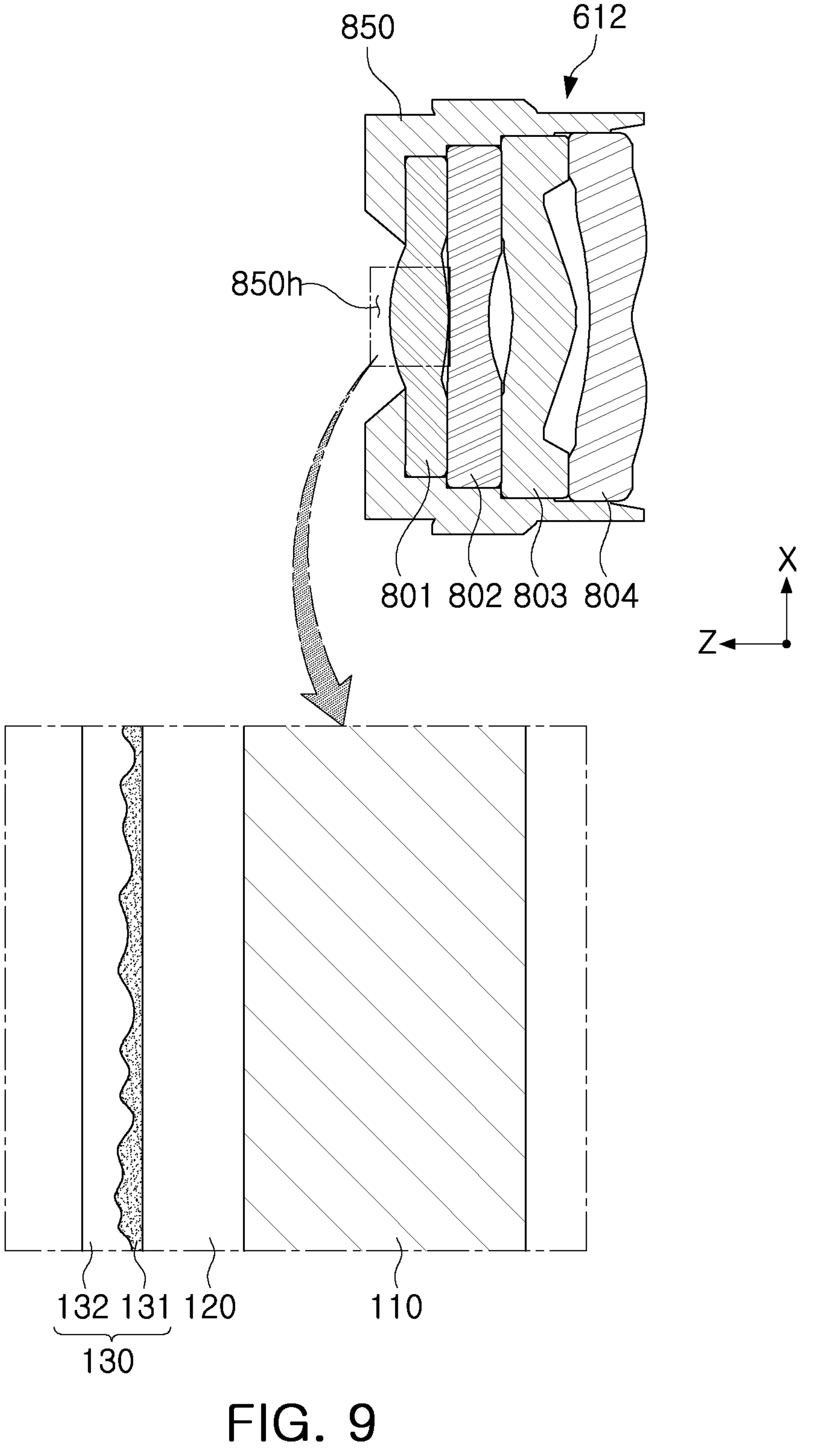

FIGS. 8 and 9 are enlarged cross-sectional views illustrating peripheral areas B and C of the lens assembly in FIGS. 6 and 7, respectively.

A portable electronic device 600 is provided in various electronic device forms such as smartphones, tablet PCs, and laptop PCs, and in this embodiment, the description is based on smartphones.

The portable electronic device 600 includes a display unit 601, a first lens assembly 611, and a second lens assembly 612 as main components.

However, if necessary, only one of the first and second lens assemblies 611 and 612 may be used.

In addition to the display unit 601 and the lens assemblies 611 and 612, as the remaining major elements (e.g., a processing module, a communication module, a touch sensing module, and the like) constituting the portable electronic device 600, configurations known in the art may be used and detailed description thereof will be omitted.

The first and second lens assemblies 611 and 612 may have the structure described in FIG. 5, and in detail, the first lens assembly 611 may include a lens barrel 750 having a lens hole 750*h* in addition to a plurality of lenses 701-704.

At least one lens 701 among the plurality of lenses 701-704 may employ a lens according to the above-described embodiments.

For example, as illustrated, the lens 701 includes a lens unit 110, an intermediate layer 120, a first coating layer 131, and a second coating layer 132.

In this case, the lens 701 including the first and second coating layers 131 and 132 may be disposed on the outermost side of the first lens assembly 611 among the plurality of lenses 701-704 in the direction in which light enters, for example, the optical axis direction (Z direction based on the drawings).

Similarly, the second lens assembly 612 may include a lens barrel 850 having a lens hole 850*h* in addition to a plurality of lenses 801-804.

At least one lens 801 among the plurality of lenses 801 to 804 may use a lens according to the above-described embodiments.

For example, as illustrated, the low-reflection lens 801 includes a lens unit 110, an intermediate layer 120, a first coating layer 131, and a second coating layer 132.

In this case, the lens 801 including the first and second coating layers 131 and 132 may be disposed on the outermost side of the second lens assembly 612 among the plurality of lenses 801-804 in the direction in which light enters, for example, the optical axis direction (Z direction based on the drawing).

As illustrated, the first lens assembly 611 may be covered by the display unit 601, and for example, may be covered by a tempered glass portion of the display unit 601.

However, in the case in which the tempered glass covers the first lens assembly 611, the tempered glass does not need to be a portion of the display unit 601.

In this case, when the first lens assembly 611 is covered by the display unit 601, or the like, the amount of light incident on the lens may be reduced, and thus, the reflectivity of the first lens assembly 611 may have a greater influence on the performance of the camera module.

In detail, in the case of the front portion of the portable electronic device 600, the first lens assembly 611 may be covered by the display unit 601, which corresponds to the so-called Under Display Camera (UDC) structure.

The UDC structure has an advantage of reducing camera hole processing, but additional tempered glass is disposed on the camera to implement the UDC structure, and the amount of light entering the camera may thus decrease, resulting in performance degradation.

Therefore, if the reflectivity of the lens in the UDC structure is relatively high, the performance of the camera module may be greatly reduced, and as in this embodiment, by disposing the lens 701 closest to the incident side, for example, the display unit 601, the effect of reducing reflectivity of the first lens assembly 611 may be significantly increased, thereby improving the performance of the camera module including the same.

This reflectivity reduction effect may be further improved when the intermediate layer 120 is implemented as an AR coating layer.

On the other hand, in the above example, the case in which the first lens assembly 611 is covered by the display unit 601 or the like is described, but depending on an embodiment, the second lens assembly 612 may also be covered by an optical element that may cause light loss, such as tempered glass or the like, and in this case, the effect of reducing reflectivity of the second lens assembly 612 may be more important.

As set forth above, in the case of a lens according to an embodiment, by introducing a multilayer structure in which a first coating layer containing a UV improving additive is formed on one side of the intermediate layer, and a second coating layer containing a water repellent is formed on one side of the first coating layer, UV reliability may be increased and durability to an external environment may be improved. Therefore, water repellent performance may be implemented or maintained for a long time.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A lens comprising:

a lens unit;

an intermediate layer disposed on one surface of the lens unit;

a first coating layer comprising a UV absorbing additive and disposed on one surface of the intermediate layer; and a second coating layer comprising a water repellent and disposed on one surface of the first coating layer, wherein a thickness of the first coating layer is 10 nm or less, and wherein the first coating layer is not provided on a portion of the one surface of the intermediate layer and the second coating layer is in contact with the one surface of the intermediate layer.

2. The lens of claim 1, wherein the intermediate layer is an Anti-Reflective (AR) coating layer.

3. The lens of claim 1, wherein a thickness of the first coating layer is 1 to 10 nm.

4. The lens of claim 1, wherein a thickness of the first coating layer is less than a thickness of the second coating layer.

5. The lens of claim 1, wherein the UV absorbing additive of the first coating layer comprises a UV absorber, an antioxidant, and a light stabilizer.

6. The lens of claim 5, wherein the UV absorbing additive further includes inorganic particles, and the inorganic particles include at least one selected from the group consisting of $CeO_2$, ZnO, $TiO_2$, and $WO_3$.

7. The lens of claim 1, wherein the intermediate layer includes at least one material layer selected from the group consisting of siloxane, $SiO_2$, SiON, $Si_3N_4$, $TiO_2$, TiON, and TiN.

8. The lens of claim 1, wherein the intermediate layer includes a multilayer structure in which a first layer and a second layer having different refractive indices are alternately stacked one or more times.

9. A portable electronic device comprising:

a lens assembly comprising the lens of claim 1; and a printed circuit board (PCB) configured to convert an image of an object formed at the imaging plane of the lens assembly into an electrical signal.

10. A lens assembly comprising:

one or more lenses, wherein at least one lens of the one or more lenses comprises a lens unit, an intermediate layer disposed on one surface of the lens unit, a first coating layer comprising a UV absorbing additive and disposed on one surface of the intermediate layer, and a second coating layer comprising a water repellent and disposed on one surface of the first coating layer, and wherein a thickness of the first coating layer is less than a thickness of the second coating layer.

11. The lens assembly of claim 10, wherein the at least one lens is disposed on an outermost side of the lens assembly among the one or more lenses in an optical axis direction.

12. The lens assembly of claim 10, wherein the at least one lens is disposed on an outermost side of the lens assembly in an optical axis direction of the at least one lens.

13. A portable electronic device comprising:

the lens assembly of claim 10; and a printed circuit board (PCB) configured to convert an image of an object formed at the imaging plane of the lens assembly into an electrical signal.

14. The portable electronic device of claim 13, further comprising a display unit configured to display an image based on the electrical signal, wherein the lens assembly is covered by the display unit.

15. The portable electronic device of claim 13, further comprising a tempered glass, wherein the lens assembly is covered by the tempered glass.

* * * * *